(12) United States Patent
Derderian et al.

(10) Patent No.: US 7,527,693 B2
(45) Date of Patent: May 5, 2009

(54) APPARATUS FOR IMPROVED DELIVERY OF METASTABLE SPECIES

(75) Inventors: Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 792 days.

(21) Appl. No.: 10/715,628

(22) Filed: Nov. 17, 2003

(65) Prior Publication Data

US 2004/0094092 A1 May 20, 2004

Related U.S. Application Data

(62) Division of application No. 10/085,588, filed on Feb. 25, 2002, now Pat. No. 6,787,185.

(51) Int. Cl.
| | |
|---|---|
| C23C 16/455 | (2006.01) |
| C23C 16/44 | (2006.01) |
| C23C 16/08 | (2006.01) |
| C23C 16/16 | (2006.01) |
| C23C 16/18 | (2006.01) |

(52) U.S. Cl. ........................ 118/719; 118/726
(58) Field of Classification Search ................ 118/715, 118/728, 710
See application file for complete search history.

(56) References Cited

U.S. PATENT DOCUMENTS

| | | | | |
|---|---|---|---|---|
| 3,110,319 | A | 11/1963 | Arata et al. | 137/340 |
| 4,217,375 | A | 8/1980 | Adams | 438/784 |
| 4,273,291 | A | 6/1981 | Muller | 239/533.12 |
| 4,319,737 | A | 3/1982 | Waterfield | 251/331 |
| 4,392,915 | A | 7/1983 | Zajac | 438/716 |
| 4,444,812 | A | 4/1984 | Gutsche | |
| 4,513,021 | A | 4/1985 | Purdes et al. | 427/579 |

(Continued)

FOREIGN PATENT DOCUMENTS

JP 61-5515 1/1986

(Continued)

OTHER PUBLICATIONS

Horii, Sadayoshi, et al., "Metalorganic Chemical Vapor Deposition of HfO2 Films through the Alternating Supply of Tetrakis(1-methoxy-2-methyl-2-propoxy)-Hafnium and Remote-Plasma Oxygen". Jpn. J. Appl. Phys. vol. 42 (2003), pp. 5176-5180, Part 1, No. 8, Aug. 15, 2003.

(Continued)

*Primary Examiner*—Rudy Zervigon
(74) *Attorney, Agent, or Firm*—Wells St. John P.S.

(57) ABSTRACT

The invention includes a deposition system having a reservoir for containment of a metastable specie connected to a deposition chamber. The system includes a metastable specie generating catalyst within the reservoir. The invention also includes an atomic layer deposition apparatus having a deposition chamber that contains a substrate platform, first and second inlets and a dispersion head positioned between the inlets and the substrate platform. The ALD apparatus includes first and second metastable specie containment reservoirs in fluid communication with the deposition chamber through the inlets. One or more sources of carrier gas are configured to deliver carrier gas through at least one of the inlets. The invention also includes an atomic layer deposition method.

12 Claims, 1 Drawing Sheet

U.S. PATENT DOCUMENTS

| | | | |
|---|---|---|---|
| 4,537,795 A | 8/1985 | Nath et al. ............... 427/569 |
| 4,545,327 A | 10/1985 | Campbell et al. |
| 4,592,933 A | 6/1986 | Meyerson et al. |
| 4,633,809 A | 1/1987 | Hirose et al. ............. 118/719 |
| 4,640,221 A | 2/1987 | Barbee et al. ............. 118/689 |
| 4,716,852 A | 1/1988 | Tsujii et al. ............... 118/720 |
| 4,724,159 A | 2/1988 | Yamazaki |
| 4,738,748 A | 4/1988 | Kisa ........................ 438/727 |
| 4,747,367 A | 5/1988 | Posa ........................ 118/715 |
| 4,761,269 A | 8/1988 | Conger et al. |
| 4,798,809 A | 1/1989 | Hirooka et al. |
| 4,805,552 A | 2/1989 | Pagendarm et al. ...... 118/325 |
| 4,872,947 A | 10/1989 | Wang et al. ............... 216/38 |
| 4,904,621 A | 2/1990 | Loewenstein et al. |
| 4,910,043 A | 3/1990 | Freeman et al. |
| 4,949,669 A | 8/1990 | Ishii et al. |
| 4,965,090 A | 10/1990 | Gartner et al. |
| 4,971,832 A | 11/1990 | Arai et al. |
| 5,000,113 A | 3/1991 | Wang et al. ............ 118/723 E |
| 5,002,928 A | 3/1991 | Fukui et al. .............. 505/401 |
| 5,068,871 A | 11/1991 | Uchida et al. |
| 5,077,875 A | 1/1992 | Hoke et al. |
| 5,093,149 A | 3/1992 | Doehler et al. |
| 5,150,734 A | 9/1992 | Chiba .................... 137/565.33 |
| 5,275,976 A | 1/1994 | Moslehi ................... 438/800 |
| 5,284,519 A * | 2/1994 | Gadgil ..................... 118/719 |
| 5,304,279 A | 4/1994 | Coultas et al. .......... 156/345.49 |
| 5,338,363 A | 8/1994 | Kawata et al. |
| 5,356,120 A | 10/1994 | Konig et al. .............. 266/175 |
| 5,362,526 A | 11/1994 | Wang et al. ............... 427/573 |
| 5,366,585 A | 11/1994 | Robertson et al. .......... 216/67 |
| 5,377,429 A | 1/1995 | Sandhu et al. .............. 34/586 |
| 5,453,124 A | 9/1995 | Moslehi et al. ........... 118/715 |
| 5,468,298 A | 11/1995 | Lei et al. .................. 118/728 |
| 5,480,818 A | 1/1996 | Matsumoto et al. ....... 438/150 |
| 5,500,256 A | 3/1996 | Watabe .................... 427/579 |
| 5,522,934 A | 6/1996 | Suzuki et al. ......... 118/723 AN |
| 5,532,190 A | 7/1996 | Goodyear et al. .......... 438/710 |
| 5,547,714 A | 8/1996 | Huck et al. ................ 427/523 |
| 5,556,474 A | 9/1996 | Otani et al. ............ 118/723 E |
| 5,564,907 A | 10/1996 | Maruyama et al. ......... 417/252 |
| 5,590,387 A | 12/1996 | Schmidt et al. ............ 419/36 |
| 5,618,349 A | 4/1997 | Yuuki |
| 5,620,523 A | 4/1997 | Maeda et al. .......... 118/723 IR |
| 5,647,912 A | 7/1997 | Kaminishizono et al. ... 118/719 |
| 5,674,574 A | 10/1997 | Atwell et al. |
| 5,678,595 A | 10/1997 | Iwabuchi ................. 137/341 |
| 5,743,457 A | 4/1998 | Benedette et al. ........... 228/33 |
| 5,746,834 A | 5/1998 | Hanley |
| 5,755,886 A | 5/1998 | Wang et al. ............... 118/715 |
| 5,772,771 A | 6/1998 | Li et al. ................... 118/723 F |
| 5,792,272 A | 8/1998 | Van Os et al. .......... 118/723 R |
| 5,824,158 A | 10/1998 | Takeuchi et al. ....... 118/723 IR |
| 5,827,370 A | 10/1998 | Gu ........................... 118/715 |
| 5,851,294 A | 12/1998 | Young |
| 5,851,849 A | 12/1998 | Comizzoli et al. ........... 438/38 |
| 5,853,484 A | 12/1998 | Jeong ...................... 118/715 |
| 5,879,459 A | 3/1999 | Gadgil et al. .............. 118/715 |
| 5,884,009 A | 3/1999 | Okase ...................... 392/418 |
| 5,885,358 A | 3/1999 | Maydan et al. ......... 118/723 R |
| 5,885,751 A | 3/1999 | Weidman et al. ........... 430/315 |
| 5,908,947 A | 6/1999 | Vaartstra ..................... 556/42 |
| 5,925,411 A | 7/1999 | van de Ven et al. |
| 5,972,430 A | 10/1999 | DiMeo et al. .......... 427/255.32 |
| 5,983,906 A | 11/1999 | Zhao et al. ................. 134/1.1 |
| 5,993,916 A | 11/1999 | Zhao et al. |
| 6,042,652 A | 3/2000 | Hyun et al. ................ 118/719 |
| 6,050,506 A | 4/2000 | Guo et al. .................. 239/558 |
| 6,056,994 A | 5/2000 | Paz de Araujo et al. ..... 427/554 |
| 6,059,885 A | 5/2000 | Ohashi et al. .............. 118/730 |
| 6,071,572 A | 6/2000 | Mosely et al. ............. 427/570 |
| 6,085,690 A | 7/2000 | Mizuno ................. 118/723 E |
| 6,086,679 A * | 7/2000 | Lee et al. ................... 118/724 |
| 6,107,152 A | 8/2000 | Derderian |
| 6,110,531 A | 8/2000 | Paz de Araujo et al. |
| 6,113,078 A | 9/2000 | Rock ........................... 261/21 |
| 6,114,227 A | 9/2000 | Leksell et al. .............. 438/584 |
| 6,132,512 A | 10/2000 | Horie et al. ............... 118/715 |
| 6,132,552 A | 10/2000 | Donohoe et al. ....... 156/345.33 |
| 6,139,700 A | 10/2000 | Kang et al. ............. 204/192.17 |
| 6,143,659 A | 11/2000 | Leem ....................... 438/688 |
| 6,144,060 A | 11/2000 | Park et al. .................. 257/310 |
| 6,174,377 B1 | 1/2001 | Doering et al. ............. 118/729 |
| 6,174,809 B1 | 1/2001 | Kang et al. ................ 438/682 |
| 6,187,101 B1 | 2/2001 | Yoshizawa ................ 118/718 |
| 6,197,119 B1 | 3/2001 | Dozoretz et al. ........... 118/715 |
| 6,200,893 B1 | 3/2001 | Sneh ........................ 438/685 |
| 6,203,613 B1 | 3/2001 | Gates et al. ................ 117/104 |
| 6,228,563 B1 | 5/2001 | Starov et al. .............. 430/327 |
| 6,237,529 B1 | 5/2001 | Spahn ...................... 118/726 |
| 6,270,572 B1 | 8/2001 | Kim et al. ................... 117/93 |
| 6,287,965 B1 | 9/2001 | Kang et al. ................ 438/648 |
| 6,294,026 B1 | 9/2001 | Roithner et al. ............ 118/715 |
| 6,297,539 B1 | 10/2001 | Ma et al. ................... 257/410 |
| 6,305,314 B1 | 10/2001 | Sneh et al. ............ 118/723 R |
| 6,312,526 B1 | 11/2001 | Yamamuka et al. ........ 118/720 |
| 6,333,268 B1 | 12/2001 | Starov et al. .............. 438/691 |
| 6,344,151 B1 | 2/2002 | Chen et al. |
| 6,419,462 B1 | 7/2002 | Horie et al. ............... 417/394 |
| 6,426,307 B2 | 7/2002 | Lim .......................... 438/778 |
| 6,444,039 B1 | 9/2002 | Nguyen .................... 118/715 |
| 6,453,992 B1 | 9/2002 | Kim ......................... 165/206 |
| 6,458,416 B1 | 10/2002 | Derderian et al. .......... 427/301 |
| 6,503,330 B1 | 1/2003 | Sneh et al. ................ 118/715 |
| 6,511,539 B1 | 1/2003 | Raaijmakers .............. 117/102 |
| 6,534,395 B2 | 3/2003 | Werkhoven et al. ........ 438/627 |
| 6,579,372 B2 | 6/2003 | Park ......................... 118/715 |
| 6,602,784 B2 | 8/2003 | Sneh ........................ 438/680 |
| 6,627,260 B2 | 9/2003 | Derderian et al. .......... 427/570 |
| 6,638,880 B2 | 10/2003 | Yamamuka et al. |
| 6,656,282 B2 | 12/2003 | Kim et al. |
| 6,677,250 B2 | 1/2004 | Campbell et al. .......... 438/758 |
| 6,730,613 B1 | 5/2004 | Hwang et al. .............. 438/758 |
| 6,787,185 B2 | 9/2004 | Derderian et al. ...... 427/255.25 |
| 6,793,736 B2 | 9/2004 | Sandhu et al. ................ 134/1 |
| 6,812,157 B1 | 11/2004 | Gadgil |
| 6,825,126 B2 | 11/2004 | Asai et al. ................. 438/722 |
| 6,890,596 B2 | 5/2005 | Sarigiannis et al. |
| 6,905,737 B2 | 6/2005 | Verplancken et al. ....... 427/576 |
| 7,066,194 B2 | 6/2006 | Ku et al. |
| 2001/0045187 A1 | 11/2001 | Uhlenbrock ............... 118/715 |
| 2002/0129768 A1 | 9/2002 | Carpenter et al. ........... 118/715 |
| 2002/0155632 A1 | 10/2002 | Yamazaki et al. ............ 438/29 |
| 2002/0157611 A1 | 10/2002 | Bondestam et al. |
| 2002/0164420 A1 | 11/2002 | Derderian et al. ........ 427/248.1 |
| 2003/0033980 A1 | 2/2003 | Campbell et al. .......... 118/715 |
| 2003/0045098 A1 | 3/2003 | Verhaverbeke et al. ...... 438/689 |
| 2003/0194861 A1 | 10/2003 | Mardian et al. |
| 2003/0194862 A1 | 10/2003 | Mardian et al. ............ 438/680 |
| 2003/0215569 A1 | 11/2003 | Mardian et al. .......... 427/248.1 |
| 2004/0083959 A1 | 5/2004 | Carpenter et al. ........... 118/715 |
| 2004/0124131 A1 | 7/2004 | Aitchison et al. .......... 210/252 |
| 2004/0144310 A1 | 7/2004 | Campbell et al. .......... 118/715 |
| 2004/0216671 A1 | 11/2004 | Carpenter et al. .......... 118/715 |

| | FOREIGN PATENT DOCUMENTS | | |
|---|---|---|---|
| JP | 02046723 | A | 2/1990 |
| JP | 02-371361 | | 12/2002 |
| WO | 0079019 | A1 | 12/2000 |
| WO | 03076678 | A2 | 9/2003 |

OTHER PUBLICATIONS

Sundqvist, J., et al., "Atomic layer deposition of polycrystalline HfO2 films by the HfI4-O2 precursor combination". Thin Solid Films. vol. 427, Issues 1-2, Mar. 3, 2003, pp. 147-151.

* cited by examiner

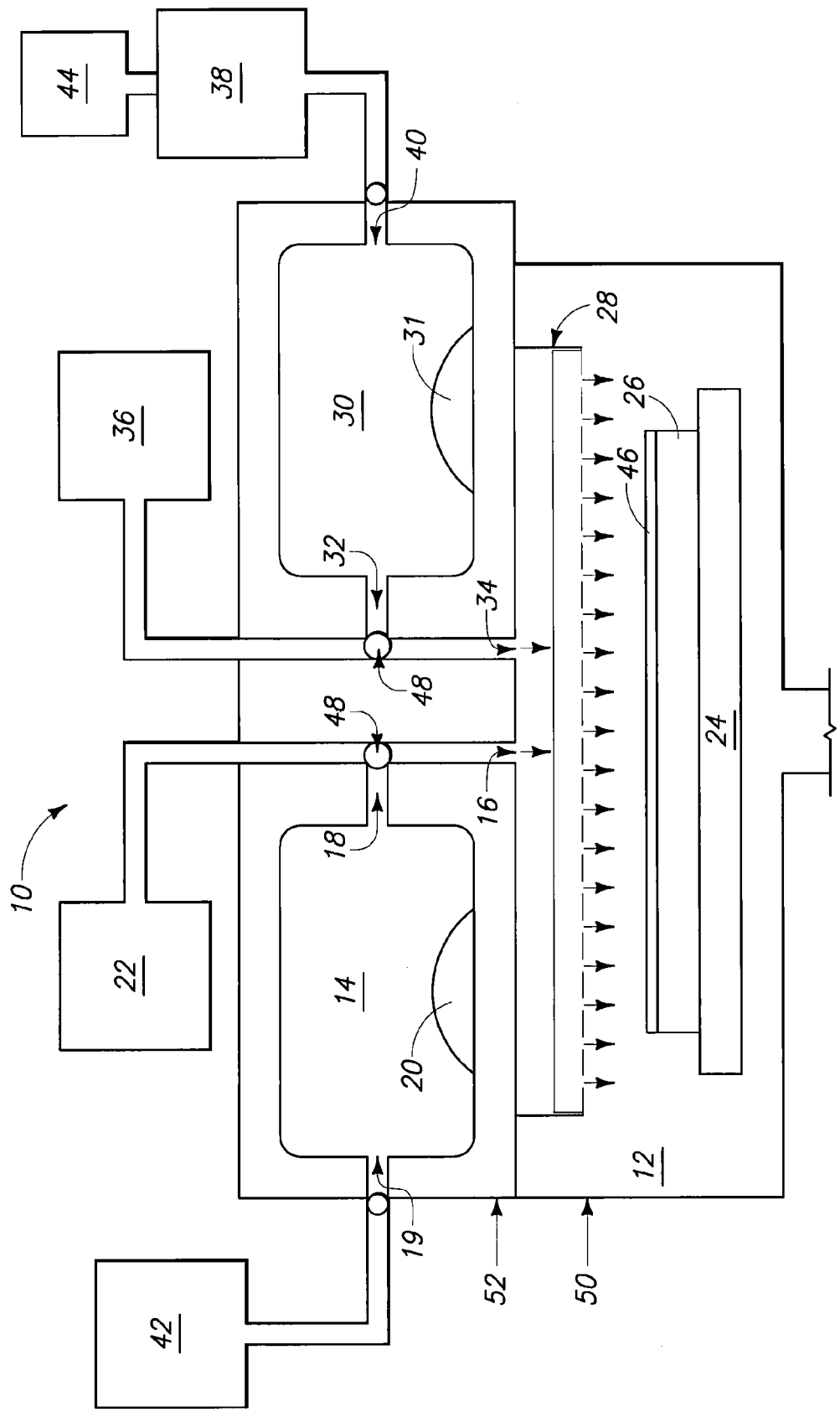

APPARATUS FOR IMPROVED DELIVERY OF METASTABLE SPECIES

RELATED PATENT DATA

This patent is a divisional of application Ser. No. 10/085,588, filed Feb. 25, 2002 now U.S. Pat. No. 6,787,185.

TECHNICAL FIELD

The present invention pertains to deposition apparatuses and methods for forming layers over a semiconductor substrate.

BACKGROUND OF THE INVENTION

Layer deposition techniques such as the various forms of chemical vapor deposition (CVD), pulsed CVD, and atomic layer deposition (ALD), are utilized to form layers upon surfaces, including surfaces of semiconductor substrates. These techniques involve providing precursor materials which react chemically to form a layer upon the surface.

Due to low reactivities of some precursor materials utilized in the deposition techniques described above, it is often desirable to enhance reactivity of precursors by generation of a metastable or an activated form of the precursor material. Once generated, the lifetimes of the metastable or activated species of the precursors are pressure dependent. Specifically, the lifetimes of metastable or activated species shorten as a result of increased pressure. Additionally, the number of unwanted side reactions between activated or metastable specie molecules increases with increased pressure. Generally, conventional layer deposition techniques that utilize metastable or activated precursors, generate or contain such precursors within a small volume under high pressure and thereby detrimentally affect the longevity of the metastable or activated form and promote unwanted side reactions.

Accordingly, it would be desirable to provide alternative methods and apparatuses for layer deposition.

BRIEF DESCRIPTION OF THE DRAWINGS

Preferred embodiments of the invention are described below with reference to the following accompanying drawing.

The FIGURE shows a diagram of a deposition chamber and a related process chemical delivery system according to an embodiment of the present invention.

SUMMARY OF THE INVENTION

In one aspect the invention encompasses a deposition system. The deposition system includes a deposition chamber and a reservoir configured for containment of a metastable specie. The reservoir includes an outlet port that is in selective fluid communication with an inlet port of the deposition chamber. The system also includes a metastable specie generating catalyst within the reservoir.

In one aspect, the invention encompasses an atomic layer deposition apparatus. The apparatus includes a deposition chamber that contains a substrate platform and has a first inlet and a second inlet. The deposition chamber contains a dispersion head positioned between the first inlet and the substrate platform and between the second inlet and the substrate platform. The atomic layer deposition apparatus also includes a first active specie containment reservoir in fluid communication with the deposition chamber through the first inlet, and a second active specie containment reservoir in fluid communication with the deposition chamber through the second inlet. One or more sources of carrier gas are configured to deliver carrier gas through at least one of the first inlet and the second inlet.

In one aspect the invention encompasses an atomic layer deposition method. A metastable specie is contained within a metastable-specie-containment reservoir. The metastable-specie-containment reservoir is in selective fluid communication with a reaction chamber and the metastable specie is flowed from the metastable-specie-containment reservoir into the reaction chamber. The flowing of the metastable specie from the metastable-specie-containment reservoir includes purging the metastable-specie-containment reservoir to flush the metastable specie from the reservoir into the reaction chamber through one or more metastable specie inlets. The flowing of the metastable specie from the metastable-specie-containment reservoir also includes compressing the metastable specie into the reaction chamber which has a volume that is less than the initial volume occupied by the metastable specie prior to flowing the metastable specie from the containment reservoir.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first specie is purged from over the substrate and a second chemical specie is provided to chemisorb onto the first monolayer of the first specie. The second specie is then purged and the steps are repeated with exposure of the second specie monolayer to the first specie. In some cases, the two monolayers may be of the same specie. Also, the second specie might not add a monolayer, but rather chemisorb onto and remove some portion of the first monolayer. Further, a third specie or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a specie contacting the substrate and/or chemisorbed specie. Examples of carrier gases include $N_2$, Ar, He, etc. Purging may instead include contacting the substrate and/or monolayer with any substance that allows chemisorption byproducts to desorb and reduces the concentration of a contacting specie preparatory to introducing another specie. The contacting specie may be reduced to some suitable concentration or partial pressure known to those skilled in the art based on the specifications for the product of a particular deposition process.

ALD is often described as a self-limiting process, in that a finite number of sites exist on a substrate to which the first specie may form chemical bonds. The second specie might only bond to the first specie and thus may also be self-limiting. Once all of the finite number of sites on a substrate are bonded with a first specie, the first specie will often not bond to other of the first specie already bonded with the substrate. However, process conditions can be varied in ALD to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include platinum, rhodium, iridium, ruthenium, osmium, palladium, or mixtures thereof, titanium nitride, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie that chemisorbs to a substrate or previously deposited specie. An ALD process regime may provide a simultaneously contacted plurality of species of a type or under conditions such that ALD chemisorption, rather than CVD reaction occurs. Instead of reacting together, the species may chemisorb to a substrate or previously deposited specie, providing a surface onto which subsequent specie may next chemisorb to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

The present invention is described with reference to the FIGURE which shows a deposition system 10 encompassed by an aspect of the present invention. Deposition system 10 includes a deposition chamber 12 having one or more inlet ports 16, 34 and a substrate platform 24 configured for retaining a substrate 26. A disperser 28 can be positioned within deposition chamber 12, between substrate platform 24 and the inlet ports. Numerous forms of disperser 28 can be utilized for purposes of the present invention including, but not limited to, a porous dispersion head or shower head.

The deposition system also includes one or more reservoirs 14, 30 in selective fluid communication with the inlet ports of deposition chamber 12. For purposes of the present description, use of the term "selective fluid communication" refers to fluid communication which can be selectively halted to result in fluid isolation of a reservoir or other compartment from the deposition chamber. Selective fluid communication from reservoirs 14 and 30 can comprise communication from reservoir outlet ports 18 and 32 respectively and through inlet ports 16 and 34 of deposition chamber 12. Selective fluid communication between reservoirs 14 and 30, and deposition chamber 12 can be achieved by providing independent deposition chamber inlet ports 16 and 34 in selective fluid communication with respective reservoir outlet ports 18 and 32, as shown in the FIGURE, or alternatively can be through a common inlet port (not shown) which provides selective fluid communication from both reservoir 14 and reservoir 30 into deposition chamber 12.

The one or more reservoirs of the present invention can be two reservoirs 14 and 30, as depicted in the FIGURE. Alternatively, deposition system 10 can comprise a single reservoir (not shown), or more than two reservoirs (not shown). As shown in the FIGURE, deposition system 10 can be configured such that the one or more reservoirs and deposition chamber 12 are within a common unit. In embodiments having one or more reservoir and deposition chamber 12 within a common unit, at least one reservoir wall 52 can be coextensive with a wall 50 of deposition chamber 12. Alternatively, the one or more reservoirs can be independent relative to the each other, relative to deposition chamber 12, or both.

One or more metastable or activated precursor materials can be provided within reservoirs 14 and 30. For purposes of the present description, use of the term "metastable" can refer to any metastable form of a precursor material, including but not limited to an activated form. It can be advantageous to provide the reservoirs of the present invention proximate deposition chamber 12 to limit the flowpath for fluid communication between the reservoirs and deposition chamber 12 and thereby minimize any decay in a metastable specie that may occur while flowing a metastable precursor material from a reservoir into the deposition chamber.

Reservoirs 14 and 30 can be configured for containment of the one or more metastable precursors. For purposes of the present description, the one or more reservoirs can alternatively be referred to as reservoirs, as containment reservoirs, or as metastable-specie-containment reservoirs. Containment of the metastable precursors within the reservoirs can comprise halting selective fluid communication from the reservoirs, and can comprise, for instance, closing a valve 48 that can be positioned between reservoir outlets 18, 32 and the corresponding deposition chamber inlet 16, 34. Although the FIGURE shows a valve, it is to be understood that numerous alternative isolation methods can be utilized.

In particular aspects of the present invention, the providing a metastable specie of a precursor within a single reservoir 14, 30 can comprise one or both of generation of the metastable specie within the reservoir and remote generation of the metastable specie. Generation of a metastable specie within a reservoir can comprise providing a source of precursor material 42, flowing the precursor material into reservoir 14 through a reservoir inlet 19, and treating the precursor material within the reservoir to generate a metastable form of the precursor material. Although the FIGURE shows a single source of precursor material 42 providing precursor material to reservoir 14, is to be understood that a plurality of precursor sources can be provided (not shown). In addition, two or more different precursor materials can be provided to a reservoir and can be allowed to premix within the reservoir and, in particular embodiments can be activated or can be partially reacted together to form a desired metastable species. For instance, $TiCl_4$ and $B_2H_6$ can be premixed and activated to form a metastable species within a common reservoir 14.

Treating of a precursor material to generate a metastable specie within reservoir 14 is not limited to a particular treatment and can include treatment comprising one or more of a catalyst, heat, plasma, UV light, microwave, electromagnetic radiation, electron-gun or sound.

As shown in FIG. 1, a metastable specie can be catalytically generated within a reservoir 14 by providing a metastable specie generating catalyst 20 within the reservoir. Additionally, deposition system 10 can include a heat source (not shown) which can be configured to heat catalyst 20. Catalyst 20 is not limited to any specific catalyst and can comprise one or more of platinum, platinum alloys, zinc, nickel, and palladium. In addition to or in place of catalyst 20, reservoir 14 can comprise one or more of a heat source and a plasma source within the reservoir for generation of a metastable specie.

In aspects of the present invention where one or more metastable species are remotely generated, deposition apparatus 10 can include one or more remote metastable specie generating sources 38 in fluid communication with one or more of the reservoirs. Although the FIGURE depicts a single remote metastable specie generating source 38 in fluid communication with a single reservoir 30, it is to be understood that the invention encompasses embodiments having multiple remote metastable specie generating sources (not shown) in fluid communication with one or more containment reservoirs. Remote metastable 38 generating source can comprise any of the metastable specie generating methods discussed above with respect to generation within reservoir 14. As shown in the FIGURE, deposition system 10 can comprise a single precursor source 44 configured to provide precursor material into remote metastable specie generating source 38 through a reservoir inlet 40. Alternatively, multiple precursor material sources can be configured to provide a single or multiple precursors into remote metastable specie generating source 38 (not shown).

The volume of containment reservoirs 14 and 30 is not limited to a specific value and can, for example, be greater than about 5.0 ml. Described relative to an internal volume of deposition chamber 12, a containment reservoir 14, 30 can comprise an individual volume of from about 1% of the internal volume of deposition chamber 12 to about 3 times the internal volume of deposition chamber 12. In particular embodiments, the combined value of the reservoirs comprised by the system of the present invention can be, for example, equal to or greater than the volume within deposition chamber 12. It is advantageous to provide relatively large volume reservoirs 14 and 30 to alleviate the detrimental effect of high pressure upon the lifetime of metastable species, and to minimize the occurrence of unwanted side reactions between molecules of a metastable specie.

Deposition system 10 can comprise one or more carrier gas sources 22 and 36 configured to deliver carrier gas through at least one reaction chamber inlet port 16 and 34. As depicted in FIG. 1, carrier gases 22 and 36 are provided into reaction chamber 12 through inlet port 16 and 34 without passing through reservoirs 14 and 30. It is to be understood, however, that the present invention encompasses embodiments where one or more carrier gas 22 or 36 is provided to flow through one or more of reservoir 14 and 30 prior to flowing into reaction chamber 12 through the respective inlet port 16 and 34. Numerous gases are available for utilization as a carrier gas for purposes of the present invention. The particular gas can be selected based upon the precursor material to be utilized. The carrier gas selected is preferably inert with respect to the particular precursor material, and with respect to the metastable forms thereof that are generated by the methods of the present invention. Such gas can comprise, but is not limited too, one or more of $N_2$, Ar, He $H_2$, Ne and Kr.

Once a metastable specie of precursor material is provided within one or more of reservoirs 14 and 30, the metastable specie can be either flowed directly into deposition chamber 12, or contained within the respective reservoir and selectively flowed from the reservoir into deposition chamber 12 through inlet port 16, 34.

As depicted in the FIGURE, deposition system 10 can comprise two reservoirs, a first metastable specie can be generated within a first reservoir 14 and a second metastable specie can be generated within a second reservoir 30. Generation of second metastable specie can utilize any of the generation methods discussed above with respect to generation within reservoir 14. As shown in the FIGURE, generation of the second metastable specie can include providing a catalyst 31 within reservoir 30. Catalyst 31 is not limited to any specific material and can comprise, for example, any of the materials discussed above with respect to catalyst 20. Catalyst 31 can comprise the same material as catalyst 20 or can comprise a material different from the material of catalyst 20. Alternatively, the second metastable specie can be remotely formed and provided to second reservoir 30 in metastable form.

It is to be understood that the invention encompasses embodiments having a single reservoir, and that generation of a metastable specie can occur within the single reservoir or can occur at a location remote from the single reservoir and the precursor material provided into the reservoir in a metastable form.

In addition to the features described above, the particular aspects of the invention can utilize a deposition system 10 comprising more than two reservoirs and can be configured for generation of metastable species within at least two of the two or more reservoirs. The invention also contemplates embodiments having two of more reservoirs where at least two reservoirs are configured for receipt of remotely generated metastable precursor. It is to be understood that, in embodiments comprising two or more reservoirs, any number or all of such reservoirs can contain the same precursor material, each reservoir may contain different a precursor material, or any combination thereof. It can be advantageous in certain deposition applications, to provide a plurality of reservoirs for generation, containment, or both generation and containment of a single metastable precursor material to allow an enhanced build-up of the activated form to occur prior to flowing the precursor into deposition chamber 12.

In methods encompassed by the present invention, a layer 46 can be formed on a substrate 26 provided on a substrate platform 24 within deposition chamber 12. One or more metastable species can be selectively flowed from one or more of reservoir 14 and 30 into deposition chamber 12 through one or more inlet ports 16 and 34. Deposition of layer 46 can comprise flowing a first metastable specie from a first reservoir 14 through chamber inlet port 16, passing the metastable specie through disperser 28 and depositing at least some of the metastable precursor onto substrate 26. Formation of layer 46 can further include flowing a second metastable specie from a second reservoir 30 through inlet port 34, passing the second metastable specie through disperser 28, and depositing at least some of the second metastable specie onto substrate 26.

In aspects of the present invention utilizing a first and a second metastable precursor, the first and the second precursor can be flowed simultaneously relative to one another, can be flowed sequentially, or the flowing of the second precursor can partially overlap the flowing of the first precursor. Deposition methods encompassed by the present invention can include embodiments appropriate for ALD applications, where the first metastable specie and the second metastable specie are flowed into the deposition chamber sequentially relative to one another. Furthermore, deposition chamber 12 can be purged after flowing the first metastable specie and prior to flowing of the second metastable specie by, for example, flowing a purge gas through the deposition chamber (not shown).

The present invention can be utilized during, for example, CVD applications where a first precursor and a second precursor are allowed to mix prior to or during layer formation. The invention can also be utilized for pulsed CVD applications where at least some of a first precursor is deposited onto the substrate prior to introduction of a second precursor.

In addition to the features described above, deposition system 10 can also include additional precursor sources configured to provide one or more additional activated or nonactivated precursor material directly into deposition chamber 12 without passing though reservoirs 14 and 30 (not shown). Such additional precursor material can be utilized during, for example, ALD, CVD or pulsed CVD applications, in conjunction with one or more metastable species provided from one or more of reservoirs 14 and 30.

Numerous precursor materials can be utilized for purposes of the present invention including but not limited to $H_2$, $TiCl_4$, $O_2$, NO, $TaF_5$, NH3, trimethyl aluminum (TMA), $SiH_4$, $O_3$, and tetrakis(dimethylamino) titanium (TDMAT). Accordingly, numerous metastable species of precursor materials can be generated.

In one specific aspect of the present invention, a source of precursor material 42 comprising hydrogen gas is provided, the hydrogen gas comprising material is flowed from precursor source 42 into reservoir 14. Activated hydrogen can be generated within chamber 14 by, for example, providing a catalyst 20 which can comprise, for instance, platinum. The activated hydrogen specie can be contained within reservoir 14 prior to flowing the activated hydrogen into deposition chamber 12. It can be advantageous to contain the activated hydrogen precursor within reservoir 14 prior to flowing the activated precursor into deposition chamber 12 to increase the time of the exposure of the precursor hydrogen to the catalyst or other metastable specie generating source, and thereby enhance or maximize formation of the metastable specie prior to deposition.

The activated hydrogen can be selectively flowed from reservoir 14 into deposition chamber 12, and such flowing can be assisted by flowing carrier gas 22 through inlet 16. Flowing of activated hydrogen can comprise flowing from reservoir 14 having a reservoir volume of greater than or equal to about 1% of the internal volume comprised by deposition chamber 12. In particular embodiments, reservoir 14 can comprise a volume greater than the internal volume the deposition chamber and the flowing of activated hydrogen from the reservoir into the deposition chamber can include compression of the activated hydrogen. It can be advantageous for reservoir 14 to comprise a relatively large volume to prolong the lifetime of the activated hydrogen specie prior to flowing the activated hydrogen into the deposition chamber.

When deposition system 10 comprises an atomic layer deposition system, deposition chamber 12 can be purged after flowing the activated hydrogen and prior to any subsequent flowing of precursor material. After adsorption of at least some of the activated hydrogen onto substrate 26, a second precursor material, for example $TiCl_4$, can be flowed into deposition chamber 12 and at least some of the second precursor can be adsorbed onto substrate 26 to react with the previously adsoprbed activated hydrogen to form layer 46.

After flowing the $TiCl_4$, deposition chamber 12 can be purged, for example, by flowing a purge gas through the deposition chamber (not shown). Repeated rounds of sequentially flowing activated hydrogen and $TiCl_4$ can be performed according to the present invention to achieve a desired thickness of layer 46.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A deposition system comprising:
   a deposition chamber having an inlet port;
   a first reservoir external to the deposition chamber configured for containment of a first metastable specie, the first reservoir comprising an outlet port in selective fluid communication with the inlet port of the deposition chamber; and
   a metastable-specie generating catalyst within the first reservoir.

2. The deposition system of claim 1 wherein the catalyst comprises Pt.

3. The deposition system of claim 1 wherein the catalyst comprises Zn.

4. The deposition system of claim 1 further comprising a heat source configured to heat the catalyst.

5. The deposition system of claim 1 further comprising a carrier gas source in selective fluid communication with the deposition chamber through the inlet port.

6. The deposition system of claim 1 further comprising:
   a substrate platform; and
   a dispersion head between the inlet port and the substrate platform.

7. The deposition system of claim 1 further comprising:
   a second reservoir configured for containment of a second metastable specie, the second reservoir comprising a second reservoir outlet port in selective fluid communication with the deposition chamber.

8. The deposition system of claim 7 wherein the inlet port of the deposition chamber is a first inlet port, the deposition chamber further comprising a second inlet port, wherein the outlet port of the second reservoir is in selective fluid communication with the deposition chamber through the second inlet port.

9. The deposition system of claim 7 wherein the metastable-specie generating catalyst is a first metastable-specie generating catalyst, and further comprising a second metastable-specie generating catalyst within the second reservoir.

10. The deposition system of claim 7 further comprising a carrier gas source in selective fluid communication with the deposition chamber through the second inlet port.

11. The deposition system of claim 7 further comprising:
a remote metastable specie source, wherein the second reservoir comprises an inlet port in fluid communication with the remote metastable specie source.

12. The deposition system of claim 11 wherein the remote metastable specie source comprises a metastable specie generator comprising one or more of a plasma source, a catalyst, a heater, an electron gun, a UV light source and a microwave source.

* * * * *